(12) United States Patent
French et al.

(10) Patent No.: US 11,916,358 B2
(45) Date of Patent: Feb. 27, 2024

(54) POWER DISTRIBUTION UNITS FOR EQUIPMENT

(71) Applicant: Dell Products L.P., Round Rock, TX (US)

(72) Inventors: Francis William French, Harvard, MA (US); Kanu Dhiru Patel, North Billerica, MA (US); Keith Clifford Johnson, Medway, MA (US)

(73) Assignee: Dell Products L.P., Round Rock, TX (US)

( * ) Notice: Subject to any disclaimer, the term of this patent is extended or adjusted under 35 U.S.C. 154(b) by 39 days.

(21) Appl. No.: 17/805,240

(22) Filed: Jun. 3, 2022

(65) Prior Publication Data

US 2022/0302684 A1   Sep. 22, 2022

Related U.S. Application Data

(62) Division of application No. 16/922,559, filed on Jul. 7, 2020, now Pat. No. 11,404,852.

(51) Int. Cl.
*H02B 1/04* (2006.01)
*H02B 1/20* (2006.01)
*H02J 13/00* (2006.01)

(52) U.S. Cl.
CPC .............. *H02B 1/04* (2013.01); *H02B 1/20* (2013.01); *H02J 13/00002* (2020.01)

(58) Field of Classification Search
None
See application file for complete search history.

(56) References Cited

U.S. PATENT DOCUMENTS

| 9,041,250 | B1 | 5/2015 | Czamara | |
|---|---|---|---|---|
| 10,613,125 | B2 | 4/2020 | Zhang | |
| 2007/0046103 | A1 | 3/2007 | Belady | |
| 2007/0159752 | A1* | 7/2007 | Ewing | H01R 25/003 361/104 |
| 2007/0217125 | A1 | 9/2007 | Johnson | |
| 2010/0208435 | A1 | 8/2010 | Ewing | |
| 2016/0345459 | A1* | 11/2016 | Mills | G06F 1/26 |
| 2017/0244274 | A1 | 8/2017 | Ewing | |
| 2017/0353015 | A1* | 12/2017 | Stevens | H02B 1/20 |
| 2019/0319413 | A1* | 10/2019 | Bhakta | H01R 24/78 |
| 2019/0372283 | A1* | 12/2019 | Irons | H05K 7/1492 |

* cited by examiner

*Primary Examiner* — Courtney L Smith
(74) *Attorney, Agent, or Firm* — McDermott Will & Emery LLP

(57) ABSTRACT

In one or more embodiments, a power distribution unit may include: multiple power distribution module (PDM) receptacles, in which each PDM receptacle is configured to receive a PDM along a longitudinal axis of the PDM receptacle and is configured with multiple conductors disposed along a plane orthogonal to the longitudinal axis; first multiple power outlets coupled to a first PDM receptacle of the multiple PDM receptacles, in which the first multiple power outlets are configured to provide first single-phase power to first multiple information handling systems housed by a rack; and second multiple power outlets coupled to a second PDM receptacle of the multiple PDM receptacles, in which the second multiple power outlets are configured to provide second single-phase power to second multiple information handling systems housed by the rack. In one or more embodiments, a monitoring device of the power distribution unit may monitor one or more environmental attributes.

8 Claims, 11 Drawing Sheets

POWER DISTRIBUTION UNITS FOR EQUIPMENT

BACKGROUND

Field of the Disclosure

This disclosure relates generally to power distribution units and more particularly to rack power distribution units for equipment.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, a power distribution unit may include: multiple power distribution module receptacles, in which each power distribution module receptacle of the multiple power distribution module receptacles is configured to receive a power distribution module along a longitudinal axis of the power distribution module receptacle and is configured with multiple conductors disposed along a plane orthogonal to the longitudinal axis; first multiple power outlets coupled to a first power distribution module receptacle of the multiple power distribution module receptacles, in which the first multiple power outlets are configured to provide first single-phase power to first multiple information handling systems housed by a rack; and second multiple power outlets coupled to a second power distribution module receptacle of the multiple power distribution module receptacles, in which the second multiple power outlets are configured to provide second single-phase power to second multiple information handling systems housed by the rack.

In one or more embodiments, the power distribution unit may be configured to be mounted to or in the rack. In one or more embodiments, the second single-phase power may be the first single-phase power. In one or more embodiments, the power distribution unit may include a power distribution unit monitoring unit. For example, power distribution unit monitoring unit may include at least one processor and a memory medium, coupled to the at least one processor, that stores instructions executable by the at least one processor, which when executed by the at least one processor, cause the power distribution unit monitoring unit to: receive, from multiple sensors, multiple values associated with environmental attributes of an environment proximate to the multiple sensors; and provide, via a network, the multiple values to at least one information handling system. In one or more embodiments, the instructions may further cause the power distribution unit monitoring unit to receive, via the network, a request for the multiple values. In one or more embodiments, the environmental attributes may include at least one of a value of temperature and a value of relative humidity, among others. In one or more embodiments, the power distribution unit monitoring unit may include a serial interface. For example, to receive the multiple values associated with the environmental attributes of the environment proximate to the multiple sensors, the instructions may further cause the power distribution unit monitoring unit to receive the multiple values via the serial interface.

In one or more embodiments, the first power distribution module receptacle may be configured to receive a first power distribution module configured to receive single-phase power. In one or more embodiments, the first power distribution module receptacle may be configured to receive a second power distribution module configured to receive three-phase power. In one example, the three-phase power may be three-phase delta power. In another example, the three-phase power may be three-phase wye power. In one or more embodiments, the first power distribution module receptacle may be configured to receive a first power distribution module configured to receive three-phase wye power, and the second power distribution module receptacle may be configured to receive a second power distribution module configured to receive three-phase delta power. In one or more embodiments, the first multiple power outlets may provide power at a first voltage, and the second multiple power outlets may provide power at a second voltage, different from the first voltage.

In one or more embodiments, the power distribution unit may further include first multiple circuit breakers and second multiple circuit breakers. In one example, a circuit breaker of the first multiple circuit breakers may be configured to interrupt a circuit between the first power distribution module receptacle and at least one of the first multiple power outlets. In another example, a circuit breaker of the second multiple circuit breakers is configured to interrupt a circuit between the second power distribution module receptacle and at least one of the second multiple power outlets.

In one or more embodiments, a power distribution module may include: multiple power receiver receptacles in a first face of the power distribution module, which is orthogonal to a longitudinal axis of the power distribution module; multiple power transmission conductors coupled to the first multiple power receptacle connectors; and a power transmission connector in a second face of the power distribution module, which is orthogonal to the longitudinal axis of the power distribution module.

In one or more embodiments, the multiple power receiver receptacles may be configured to receive three-phase power. For example, the multiple power transmission conductors may be configured to: provide a first phase of the three-phase power to a first conductor of the power transmission connectors; provide a second phase of the three-phase power to a second conductor of the power transmission connectors; and provide a third phase of the three-phase power to a third conductor of the power transmission connectors. In one instance, the three-phase power may be three-phase wye power. In another instance, the three-phase power may be three-phase delta power.

In one or more embodiments, one or more systems, one or more methods, and/or one or more processes may receive, from multiple sensors, multiple values associated with environmental attributes of an environment proximate to the multiple sensors; may provide, via a network, the multiple values to at least one information handling system. In one or more embodiments, the one or more systems, the one or more methods, and/or the one or more processes may further determine that at least one of the multiple values is at or above a threshold value; and may further provide, via the network, information indicating that the at least one of the multiple values is at or above the threshold value to the at least one information handling system. In one or more embodiments, the one or more systems, the one or more methods, and/or the one or more processes may further receive, via the network, a request for the multiple values.

In one or more embodiments, the environmental attributes may include at least one of a value of temperature and a value of relative humidity, among others. In one or more embodiments, the one or more systems, the one or more methods, and/or the one or more processes may receive the multiple values via a serial interface. In one or more embodiments, the one or more systems, the one or more methods, and/or the one or more processes may further determine that at least one of the multiple values is at or above a threshold value; and may further provide, via the network, information indicating that the at least one of the multiple values is at or above the threshold value to the at least one information handling system.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1:
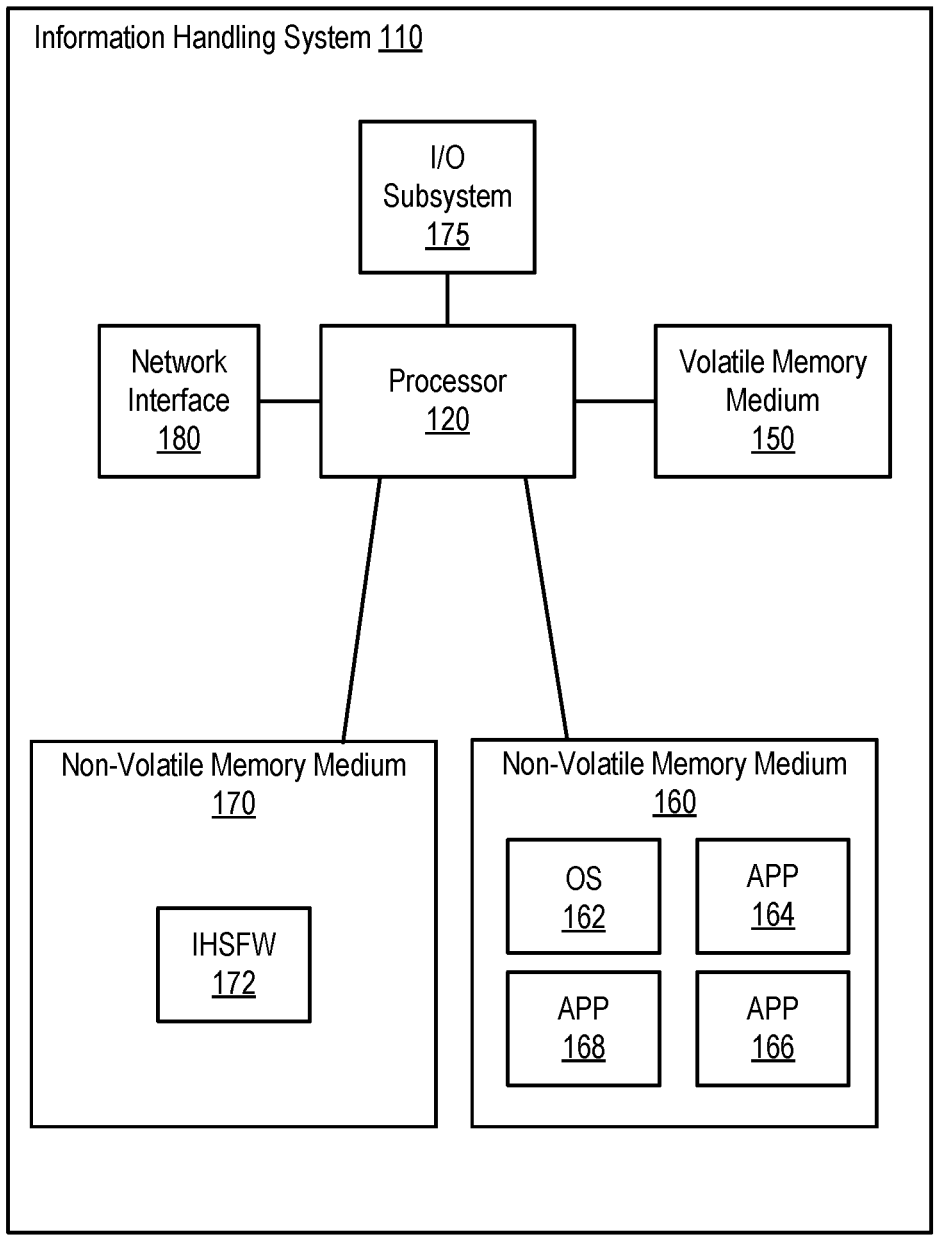
FIG. 1 illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, a rack may house information handling systems and/or other equipment. A rack may include a frame and/or an enclosure (e.g., a cabinet) for mounting equipment. Equipment may be designed to be placed in a rack may be described as rack-mount, rack-mountable, a rack-mount chassis, a rack-mounted system, a subrack, etc. Occasionally, equipment may simply include a shelf. In one or more embodiments, a height unit may be standardized to 1.75 inches (44.45 mm) or one rack unit or simply "U". One industry standard rack cabinet is "42U" tall, while another industry standard rack cabinet is "45U" tall. In one example, the equipment may include one or more information handling systems, among others. In another example, the equipment may include telecommunications equipment, networking hardware (e.g., one or more network switches, one or more network routers, etc.), audiovisual production equipment, scientific equipment, keyboards, non-volatile memory media, and/or displays, among others, in lieu of or in addition to one or more information handling systems. In one or more embodiments, a rack may include edges or "ears" which may protrude from each side of the frame of the rack, which may permit equipment to be fastened to the frame of the rack with screws. For example, one or more power distribution units (PDUs) may be fastened to the frame of the rack.

In one or more embodiments, a power distribution unit (PDU) may provide power to one or more information handling systems and/or other equipment of a rack. For example, the PDU may receive power via one or more power input receptacles and may provide the power via one or more power outlets. In one or more embodiments, a PDU may be configured to receive and utilize one or more of single phase, three-phase delta, and three-phase wye (i.e., three-phase "Y") power. In one or more embodiments, a PDU may be configured to energize additional power outlets. For example, the PDU may be configured with a jumper to energize the additional power outlets.

In one or more embodiments, to change a power type of a PDU in the field, power cables may be unplugged from respective outlets and the PDU may be removed. A new PDU may be installed and the power cables may be plugged into the outlets. A service process may be executed (e.g., an application, a script, etc.) to confirm that the cables were correctly plugged into the power outlets. In one or more embodiments, this may be a time consuming and/or may potentially be a disruptive upgrade process in the field (e.g., a manufacturing facility, in a server room, etc.).

In one or more embodiments, a PDU may be configured to utilize one or more power distribution modules (PDMs). For example, a power distribution module (PDM) may be configured to be removable. For instance, a PDM may be configured to be plugged into a PDU and/or may be configured to be unplugged from the PDU. In one or more embodiments, a PDM may receive power and may provide the power to the PDU. In one example, the PDM may receive single-phase power. In another example, the PDM may receive three-phase power. In one instance, the three-phase power may be three-phase wye power. In another instance, the three-phase power may be three-phase delta power. In one or more embodiments, a PDM may include mating hardware that may align with mating hardware of a PDU. For example, the mating hardware of the PDM may include one or more spring actuating locking pins, which may secure the PDM to the PDU. In one or more embodiments, the PDM may receive power via one or more power cords. For example, a power cord may be a single-phase power cord, a three-phase wye power cord, or a three-phase delta power cord. For instance, utilizing multiple power cords, a PDU may achieve over 28 kW of power distribution capacity.

In one or more embodiments, to change a power type, a first PDM configured for a first power type may be removed and replaced with a second PDM configured for a second power type, different from the first power type. For example, a PDU may remain in place. For instance, since the PDU chassis may remain in place, power cords coupled to one or more information handling systems and/or other equipment may not need to be moved and/or unplugged when changing out the first PDM for the second PDM. This may minimize downtime for one or more information handling systems and/or other equipment powered by the PDU and/or provide for more time for processing information, according to one or more embodiments.

In one or more embodiments, one or more systems, one or more methods, and/or one or more processes may monitor one or more of power consumption of one or more information handling systems and/or may monitor one or more monitor environmental attributes. For example, the one or more environmental attributes may include one or more of ambient temperature and relative humidity, among others. For example, a PDU may monitor the one or more of power consumption of one or more information handling systems and/or may monitor the one or more monitor environmental attributes. For instance, the PDU may include a PDU monitoring unit that may monitor the one or more of power consumption of one or more information handling systems and/or may monitor the one or more monitor environmental attributes.

In one or more embodiments, the PDU monitoring unit may utilize one or more monitoring devices to monitor the one or more of power consumption of one or more information handling systems and/or to monitor the one or more monitor environmental attributes. In one example, a monitoring device may include one or more power sensors. For instance, a power sensor may determine a value of power provided to one or more information handling systems. In another example, a monitoring device may include one or more environmental sensors. For instance, an environmental sensor may determine one or more values associated with temperature, humidity, etc. In one or more embodiments, a PDU monitoring unit may be coupled to a network. For example, the PDU monitoring unit may be coupled to a network of a server room, a network of a datacenter, etc. For instance, one or more analytics may be determined based at least on data provided by the PDU monitoring unit. The data provided by the PDU monitoring unit may be based at least on information from the one or more sensors.

In one or more embodiments, a monitoring system may be utilized with a PDU. For example, a PDU may be configured with one or more sensors that may be utilized to determine one or more of voltage, current, power, and power factor, among others. For instance, the one or more sensors of the PDU may be communicatively coupled to the monitoring system. In one or more embodiments, the monitoring system may be coupled to a network. For example, the monitoring system may be coupled to a network of a server room, a network of a datacenter, etc. For instance, one or more analytics may be determined based at least on data provided by the monitoring system. The data provided by the monitoring system may be based at least on information from the one or more sensors.

Turning now to FIG. 1, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit (I²C) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, a volatile memory medium 150, non-volatile memory media 160 and 170, an I/O subsystem 175, and a network interface 180. As illustrated, volatile memory medium 150, non-volatile memory media 160 and 170, I/O subsystem 175, and network interface 180 may be communicatively coupled to processor 120.

In one or more embodiments, one or more of volatile memory medium 150, non-volatile memory media 160 and 170, I/O subsystem 175, and network interface 180 may be communicatively coupled to processor 120 via one or more buses, one or more switches, and/or one or more root complexes, among others. In one example, one or more of volatile memory medium 150, non-volatile memory media 160 and 170, I/O subsystem 175, and network interface 180 may be communicatively coupled to processor 120 via one or more PCI-Express (PCIe) root complexes. In another example, one or more of an I/O subsystem 175 and a network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing at least a portion of one or more systems, at least a portion of one or more flowcharts, at least a portion of one or more methods, and/or at least a portion of one or more processes described herein. In one example, processor 120 may execute processor instructions from one or more of memory media 150, 160, and 170 in implementing at least a portion of one or more systems, at least a portion of one or more flowcharts, at least a portion of one or more methods, and/or at least a portion of one or more processes described herein. In another example, processor 120 may execute processor instructions via network interface 180 in implementing at least a portion of one or more systems, at least a portion of one or more flowcharts, at least a portion of one or more methods, and/or at least a portion of one or more processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150, 160, and 170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, processor 120 and one or more components of IHS 110 may be included in a system-on-chip (SoC). For example, the SoC may include processor 120 and a platform controller hub (not specifically illustrated).

Figure 2A:
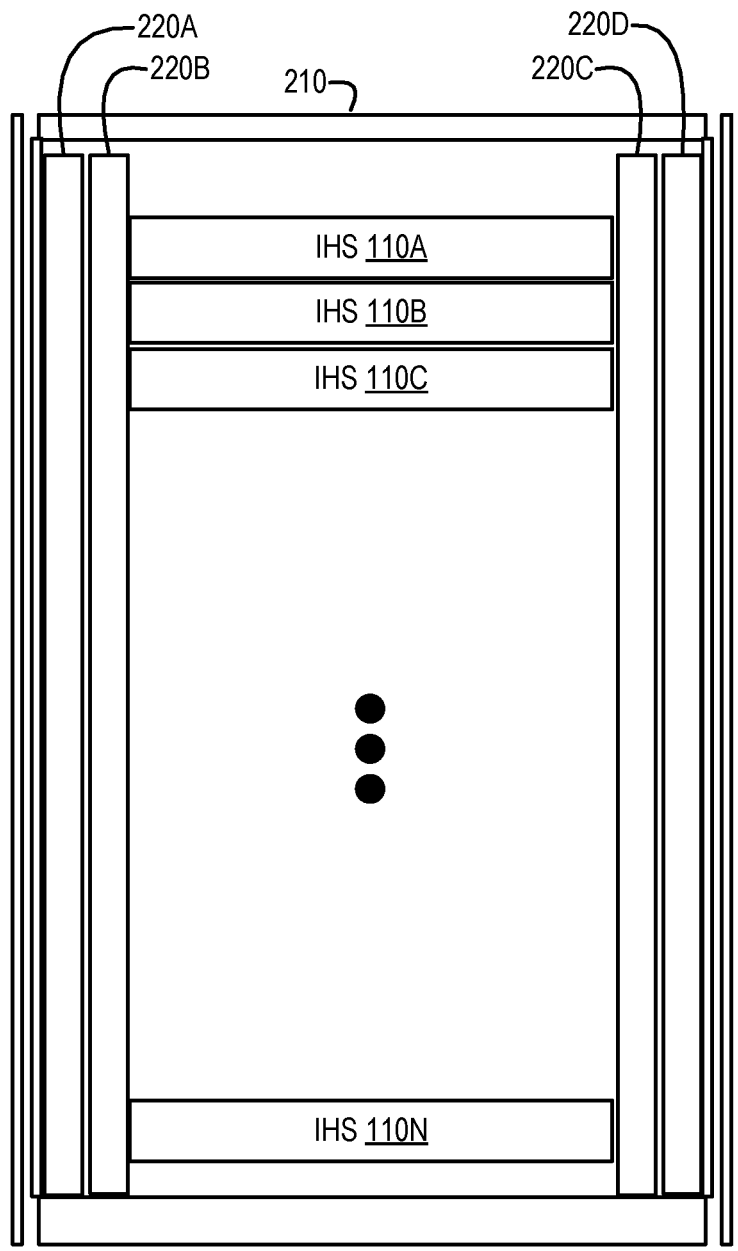
FIG. 2A illustrates an example of a rack and multiple power distribution modules, according to one or more embodiments.

Turning now to FIG. 2A, an example of a rack and multiple power distribution modules is illustrated, according to one or more embodiments. As illustrated, a rack 210 may house information handling systems (IHSs) 110A-110N. In one or more embodiments, rack 210 may include a frame and/or an enclosure (e.g., a cabinet) for mounting equipment. For example, the equipment may include IHSs 110A-110N, among others. For instance, the equipment modules may include telecommunications equipment, networking hardware (e.g., one or more network switches, one or more network routers, etc.), audiovisual production equipment, scientific equipment, keyboards, non-volatile memory media, and/or displays, among others, in lieu of or in addition to IHSs 110A-110N. In one or more embodiments, rack 210 may include edges or "ears" which may protrude from each side of the frame of rack 210 that may permit equipment to be fastened to the frame of rack 210 with screws.

As illustrated, PDUs 220A-220D may be mounted to the frame of rack 210. In one or more embodiments, a PDU 220 may receive power from a power provider and distribute the power to equipment. For example, power distribution module PDU 220 may receive power from the power provider and distribute the power to at least a portion of IHSs 110A-110N. In one instance, power distribution module PDU 220 may receive power from the power provider via single phase power and distribute the power via single phase power to the at least the portion of IHSs 110A-110N. In a second instance, power distribution module PDU 220 may receive power from the power provider via three phase delta power and distribute the power via single phase power to the at least the portion of IHSs 110A-110N. In another instance, power distribution module PDU 220 may receive power from the power provider via three phase wye power and distribute the power via single phase power to the at least the portion of IHSs 110A-110N.

Figure 2B:
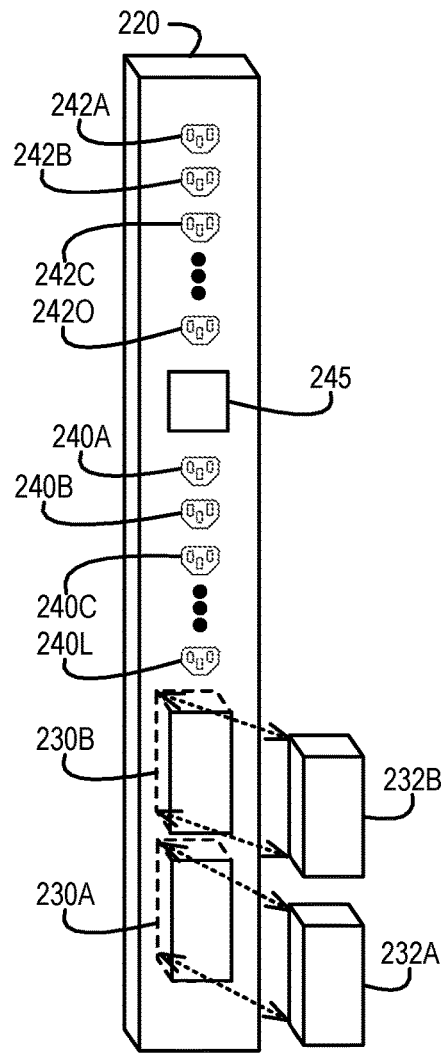
FIG. 2B illustrates an example of a power distribution unit, according to one or more embodiments.

Turning now to FIG. 2B, an example of a power distribution unit is illustrated, according to one or more embodiments. As shown, PDU 220 may include power distribution module receptacles (PDMRs) 230A and 230B. In one or more embodiments, a power distribution module (PDM) 232 may be plugged into and/or removed from a power distribution module receptacle (PDMR) 230. As illustrated, power distribution modules (PDMs) 232A and 232B may be plugged into or removed from PDMR 230A and 230B, respectively. As shown, PDU 220 may include power outlets 240A-240L and 242A-242O. In one example, power from a PDM 232 plugged into PDMR 230A may provide power to outlets 240A-240L. In another example, power from a PDM 232 plugged into PDMR 230B may provide power to outlets 242A-242O. As illustrated, PDU 220 may include a PDU monitoring unit (PMU) 245. In one or more embodiments, PDU 220 may not include a PMU 245. For example, PDU 220 may be optionally implemented with or without a PMU 245.

Figure 2C:
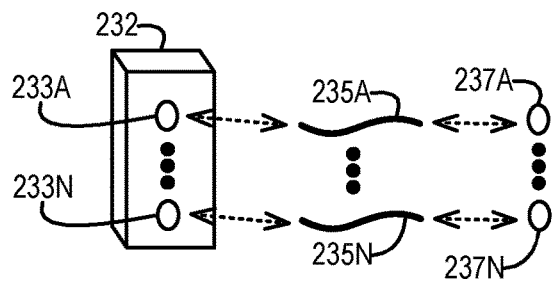
FIG. 2C illustrates an example of a power distribution module, power cords, and power provider receptacles, according to one or more embodiments.

Turning now to FIG. 2C, an example of a power distribution module, power cords, and power provider receptacles is illustrated, according to one or more embodiments. As shown, PDM 232 may include power receiver receptacles 233A-233N. As illustrated, power cords 235A-235N may be plugged into and/or removed from power receiver receptacles 233A-233N. As shown, power cords 235A-235N may be plugged into and/or removed from power provider receptacles 237A-237N, respectively. In one example, a power provider receptacle 237 of power provider receptacles 237A-237N may provide single-phase power. In another example, a power provider receptacle 237 power provider receptacles 237A-237N may provide three-phase power. In one instance, the three-phase power may be the three-phase delta power. In another instance, the three-phase power may be the three-phase wye power.

Figure 2D:
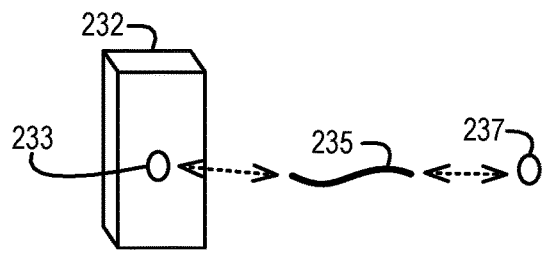
FIG. 2D illustrates an example of a power distribution module, a power cord, and a power provider receptacle, according to one or more embodiments.

Turning now to FIG. 2D, an example of a power distribution module, a power cord, and a power provider receptacle is illustrated, according to one or more embodiments. As shown, PDM 232 may include a single power receiver receptacles 233. As illustrated, a single power cord 235 may be plugged into and/or removed from a single power receiver receptacle 233. As shown, power cord 235 may be plugged into and/or removed from power provider receptacles. In one example, power provider receptacle 237 may provide single-phase power. In another example, power provider receptacle 237 may provide three-phase power. In one instance, the three-phase power may be the three-phase delta power. In another instance, the three-phase power may be the three-phase wye power.

Figure 2E:
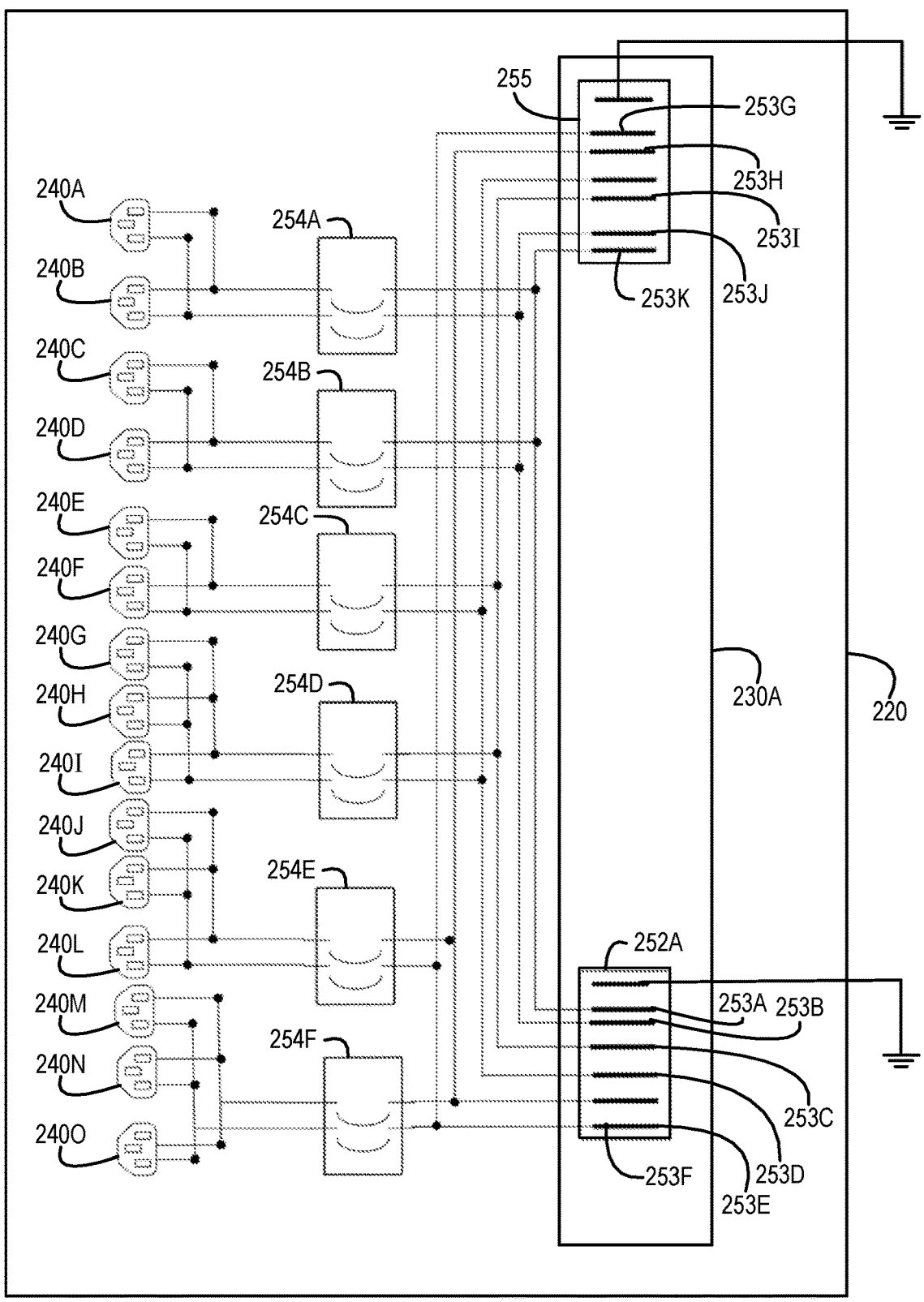
FIG. 2E illustrates an example schematic diagram of a power distribution module receptacle, according to one or more embodiments.

Turning now to FIG. 2E, an example schematic diagram of a power distribution module receptacle is illustrated, according to one or more embodiments. As shown, PDMR 230A may include a power receiver interface 252A. As illustrated, power receiver interface 252A may include conductors 253A-253F. For example, conductors 253A-253F may interface with conductors of a PDM 232. As shown, PDU 220 may include circuit breakers 254A-254F. In one example, circuit breaker 254A may conduct power or interrupt power from conductors 253A and 253B and power outlets 240A and 240B. In a second example, circuit breaker 254B may conduct power or interrupt power from conductors 253A and 253B and power outlets 240C and 240D. In a third example, circuit breaker 254C may conduct power or interrupt power from conductors 253C and 253D and power outlets 240E and 240F. In a fourth example, circuit breaker 254D may conduct power or interrupt power from conductors 253C and 253D and power outlets 240G-240I. In a fifth example, circuit breaker 254E may conduct power or interrupt power from conductors 253E and 253F and power outlets 240J-240L. In another example, circuit breaker 254F may conduct power or interrupt power from conductors 253E and 253F and power outlets 240M-240O.

As illustrated, PDMR 230A may include a power provider interface 255. For example, power provider interface 255 may provide power to a power receiver interface of PDMR 230B. In one or more embodiments, a power outlet 240 may include a power socket, which may include three conductors. For example, the three conductors of the power socket may include a hot conductor, a neutral conductor, and a ground conductor. For instance, a power outlet 240 may provide power to an IHS 110 or other equipment housed by rack 210. In one or more embodiments, power outlet 240 may provide power at any voltage. In one example, power outlet 240 may provide power at one hundred and twenty volts (120V). For instance, power outlet 240 may provide alternating current power at one hundred and twenty volts (120 VAC). In another example, power outlet 240 may provide power at two hundred and forty volts (240V). For instance, power outlet 240 may provide alternating current power at two hundred and forty volts (240 VAC).

Figure 2F:
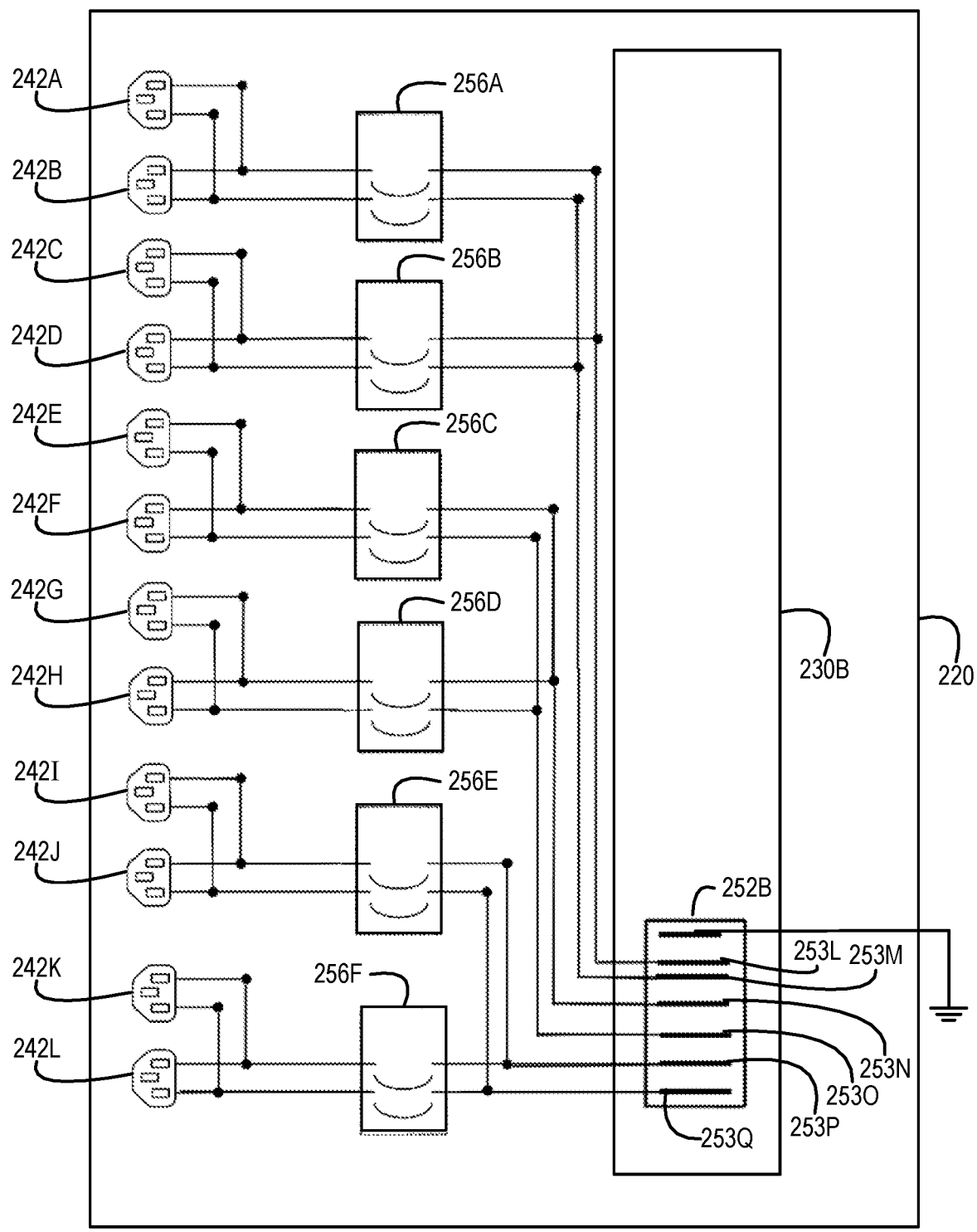
FIG. 2F illustrates another example schematic diagram of another power distribution module receptacle, according to one or more embodiments.

Turning now to FIG. 2F, another example schematic diagram of another power distribution module receptacle is illustrated, according to one or more embodiments. As shown, PDMR 230B may include a power receiver interface 252B. As illustrated, power receiver interface 252B may include conductors 253L-253Q. In one example, conductors 253L-253Q may interface with conductors of a PDM 232. In another example, conductors 253L-253Q may interface with conductors of a jumper that may couple conductors 253L-253Q to conductors 253G-253K, respectively.

As shown, PDU 220 may include circuit breakers 256A-256F. In one example, circuit breaker 256A may conduct power or interrupt power from conductors 253M and 253N and power outlets 242A and 242B. In a second example, circuit breaker 256B may conduct power or interrupt power from conductors 253M and 253N and power outlets 242C and 242D. In a third example, circuit breaker 256C may conduct power or interrupt power from conductors 253O and 253P and power outlets 242E and 242F. In a fourth example, circuit breaker 256D may conduct power or interrupt power from conductors 253O and 253P and power outlets 242G and 242H. In a fifth example, circuit breaker 256E may conduct power or interrupt power from conductors 253Q and 253R and power outlets 242I and 242J. In another example, circuit breaker 256F may conduct power or interrupt power from conductors 253Q and 253R and power outlets 42K and 242L.

In one or more embodiments, a power outlet 242 may include a power socket, which may include three conductors. In one or more embodiments, power outlet 242 may include one or more structures and/or functionalities as those described with reference to power outlet 240. For example, the three conductors of power outlet 242 may include a hot conductor, a neutral conductor, and a ground conductor. For instance, a power outlet 242 may provide power to an IHS 110 or other equipment housed by rack 210. In one or more embodiments, power outlet 242 may provide power at any voltage. In one example, power outlet 242 may provide power at one hundred and twenty volts (120V). For instance, power outlet 242 may provide alternating current power at one hundred and twenty volts (120 VAC). In another example, power outlet 242 may provide power at two hundred and forty volts (240V). For instance, power outlet 242 may provide alternating current power at two hundred and forty volts (240 VAC).

Figure 2G:
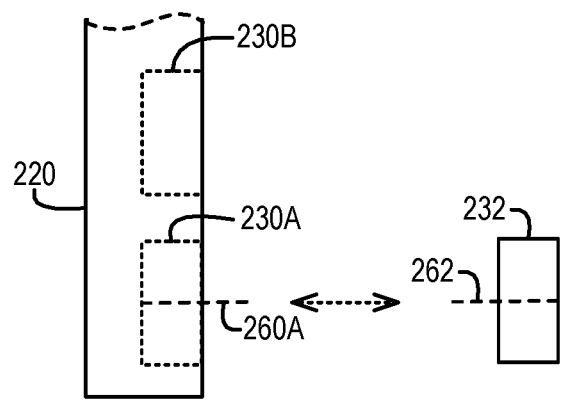
FIGS. 2G and 2H illustrate examples of power distribution units and power distribution modules, according to one or more embodiments.
Figure 2H:
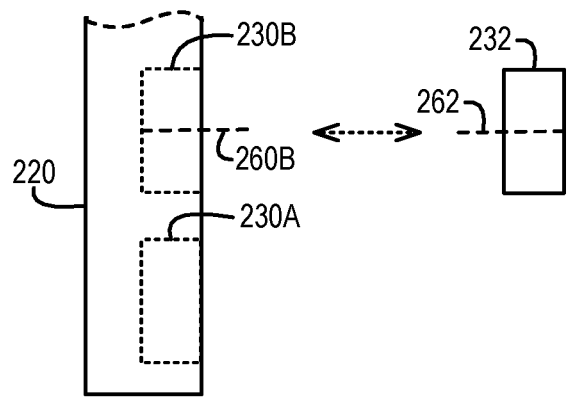

Turning now to FIGS. 2G and 2H, examples of power distribution units and power distribution modules are illustrated, according to one or more embodiments. In one or more embodiments, a PDM 232 may be plugged into and/or removed from a PDMR 230. As shown in FIG. 2G, a PDM 232 may be plugged into and/or removed from PDMR 230A. For example, a longitudinal axis 262 of PDM 232 may align with a longitudinal axis 260A of PDMR 230A when PDM 232 is plugged into and/or removed from PDMR 230A. In one instance, conductors 253A-253F may be disposed along a plane orthogonal to longitudinal axis 260A. Conductors 253A-253F may be configured to be coupled to conductors of a PDM 232. In another instance, conductors 253G-253K may be disposed along a plane orthogonal to longitudinal axis 260A. Conductors 253G-253K may be configured to be coupled to conductors of a jumper. As illustrated in FIG. 2H, a PDM 232 may be plugged into and/or removed from PDMR 230B. For example, longitudinal axis 262 of PDM 232 may align with a longitudinal axis 260B of PDMR 230B when PDM 232 is plugged into and/or removed from PDMR 230B. For instance, conductors 253L-253Q may be disposed along a plane orthogonal to longitudinal axis 260B. Conductors 253L-253Q may be configured to be coupled to conductors of a PDM 232.

Turning now to FIGS. 2I-2L, examples of power distribution units and power distribution modules are illustrated, according to one or more embodiments. In one or more embodiments, a PDM 232 may be plugged into and/or removed from a PDMR 230. In one example, PDM 232 may be a single-phase power PDM. In a second example, PDM 232 may be a three-phase delta power PDM. In another example, PDM 232 may be a three-phase wye power PDM. In one or more embodiments, same power type PDMs 232 may be plugged into and/or removed from PDMRs 230A and 230B. In one example, PDMs 232 may be single-phase power PDMs. In a second example, PDMs 232 may be three-phase delta power PDMs. In another example, PDMs 232 may be three-phase wye power PDMs. In one or more embodiments, different power type PDMs 232 may be plugged into and/or removed from PDMRs 230A and 230B. In one example, a first PDM 232 may be a single-phase power PDM, and a second PDM 232 may be a three-phase delta power PDM. In a second example, a first PDM 232 may be a single-phase power PDM, and a second PDM 232 may be a three-phase wye power PDM. In another example, a first PDM 232 may be a three-phase delta power PDM, and a second PDM 232 may be a three-phase wye power PDM.

Figure 2I:
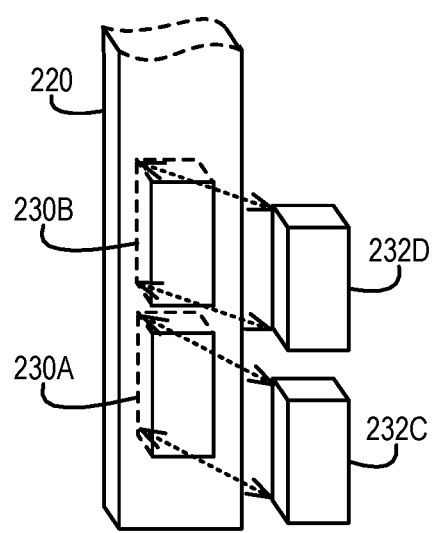
FIGS. 2I-2L illustrate examples of power distribution units and power distribution modules, according to one or more embodiments.
Figure 2J:
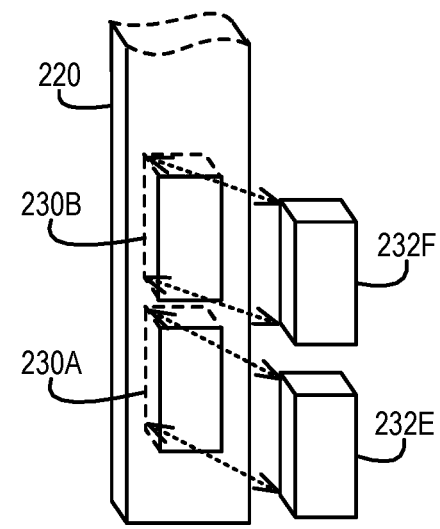
Figure 2K:
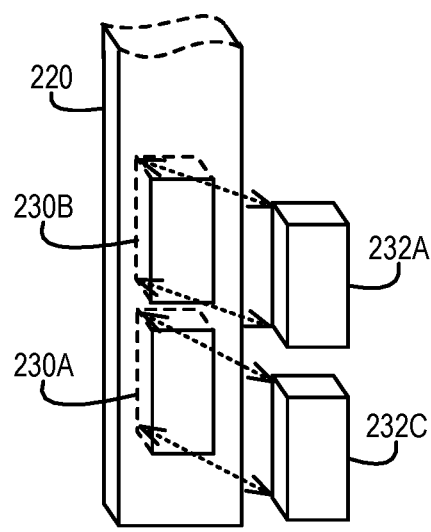
Figure 2L:
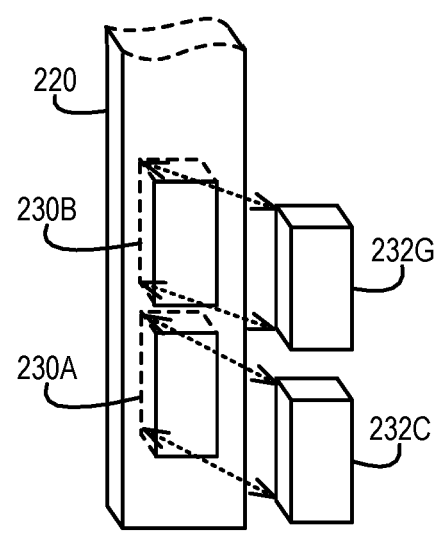

As shown in FIG. 2I, PDMs 232C and 232D may be plugged into and/or removed from PDMRs 230A and 230B, respectively. For example, PDMs 232C and 232D may receive three-phase delta power. As illustrated in FIG. 2J, PDMs 232E and 232F may be plugged into and/or removed from PDMRs 230A and 230B, respectively. For example, PDMs 232E and 232F may receive three-phase wye power. As shown in FIG. 2K, PDMs 232C and 232A may be plugged into and/or removed from PDMRs 230A and 230B, respectively. For example, PDM 232C may receive three-phase wye power, and PDM 232A may receive singe-phase power. In one or more embodiments, PDMs 232A and 232B may receive singe-phase power. As illustrated in FIG. 2L, PDMs 232C and 232G may be plugged into and/or removed from PDMRs 230A and 230B, respectively. For example, PDM 232G may receive power from a jumper that couples conductors of PDM 232C to conductors of PDM 232G. In one or more embodiments, a PDM 232 of any power type (e.g., singe-phase power, three-phase wye power, or three-phase delta power) may be plugged into and/or removed from a PDMR 230. In one or more embodiments, PDM 232G may be plugged into and/or removed from PDMR 230B. For example, PDM 232G may receive power from a PDM 232 that receives power from a power cord 235.

Figure 2M:
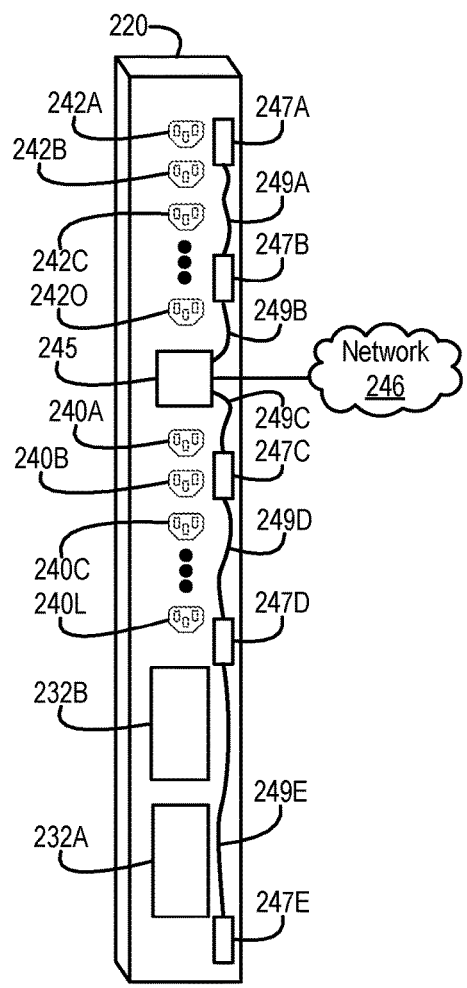
FIGS. 2M and 2N illustrate examples of environmental monitoring units, according to one or more embodiments.
Figure 2N:
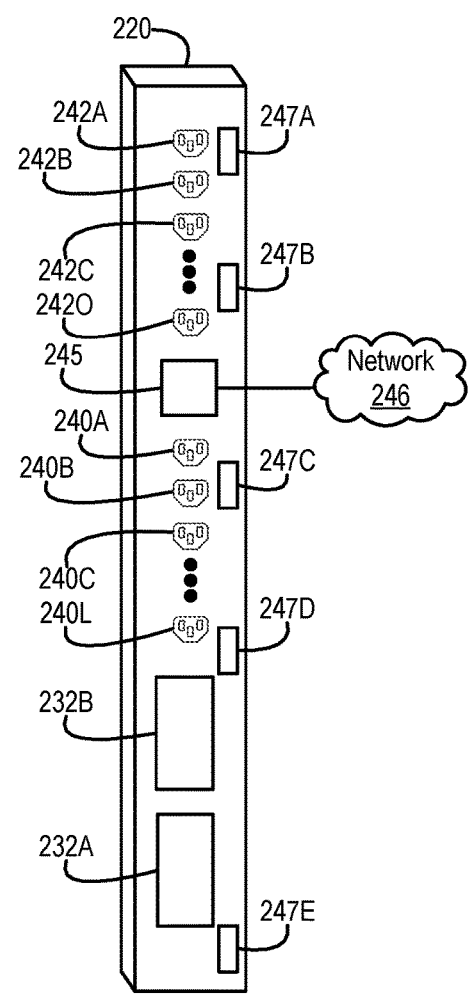

Turning now to FIGS. 2M and 2N, examples of environmental monitoring units are illustrated, according to one or more embodiments. As shown in FIGS. 2M and 2N, monitoring devices 247A-247E may be mounted to PMS 220. In one or more embodiments, monitoring devices 247A-247E may be mounted within PMS 220. In one or more embodiments, monitoring devices 247A-247E may be mounted on an outside surface of PMS 220. As illustrated in FIGS. 2M and 2N, PMU 245 may be coupled to a network 246. In one or more embodiments, network 246 may include a wired network, a wireless network, an optical network, or a combination of the foregoing, among others. In one or more embodiments, network 246 may include and/or be coupled to various types of communications networks. For example, network 246 may include and/or be coupled to a LAN, a WAN (e.g., a private WAN, a corporate WAN, a public WAN, etc.), an Internet, a public switched telephone network (PSTN), a cellular telephone network, a satellite telephone network, or a combination of the foregoing, among others.

As shown in FIG. 2M, PMU 245 may be coupled to monitoring device 247B via a cable 249B. In one or more embodiments, a cable 249 may be configured to provide data communications and/or may be configured to provide power. In one example, cable 249 may be configured to provide data communications between PMU 245 and a monitoring device 247. In a second example, cable 249 may be configured to provide data communications between two monitoring devices 247. For instance, cable 249A may be configured to provide data communications between monitoring devices 247A and 247B. In a third example, cable 249 may be configured to provide power to a monitoring device 247. In one instance, cable 249B may be configured to provide power to monitoring device 247B. As an example, cable 249B may be configured to provide power from PMU 245 to monitoring device 247B. In another instance, cable 249A may be configured to provide power to monitoring device 247A. As an example, cable 249A may be configured to provide power from monitoring device 247B to monitoring device 247A. In one or more embodiments, PMU 245 and a monitoring device 247 may communicate data via one or more cables 249. In one example, PMU 245 and monitoring device 247B may communicate data via cable 249B. In another example, PMU 245 and monitoring device 247A may communicate data via cables 249A and 249B.

As shown in FIG. 2N, PMU 245 and a monitoring device 247 may not be coupled via one or more cables 249. In one or more embodiments, PMU 245 and monitoring device 247 may communicate data in a wireless fashion. In one example, PMU 245 and monitoring device 247 may communicate data directly in a wireless fashion. In another example, multiple monitoring devices 247 may be daisy-chained together. For instance, a monitoring device 247 may relay data for one or more other monitoring devices 247. In one or more embodiments, a first monitoring device 247 and a second monitoring device 247 may communicate data in a wireless fashion.

In one or more embodiments, a monitoring device 247 may include one or more sensors. For example, the one or more sensors may determine one or more environmental attributes. For instance, the one or more environmental attributes may include one or more of ambient temperature, relative humidity, vibrations, and seismic activity, among others. In one or more embodiments, PMU 245 may provide data to an IHS 110. For example, PMU 245 may provide data to an IHS 110 via network 246. For instance, the data may include one or more values of one or more monitor environmental attributes.

Figure 3A:
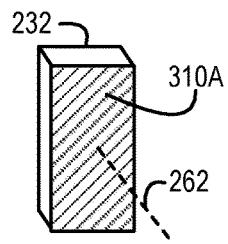
FIGS. 3A-3E illustrate examples of a power distribution module, according to one or more embodiments.
Figure 3B:
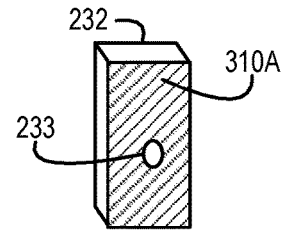
Figure 3C:
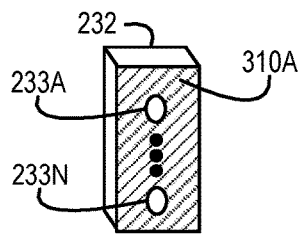
Figure 3D:
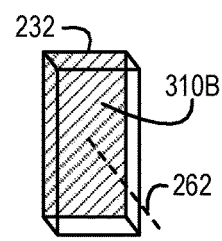
Figure 3E:
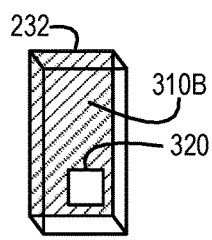

Turning now to FIGS. 3A-3E, examples of a power distribution module are illustrated, according to one or more embodiments. As shown in FIG. 3A, PDM 232 may have a face 310A. As illustrated, face 310A may be orthogonal to longitudinal axis 262. As shown in FIG. 3B, face 310A may include a single power receiver receptacle 233. For example, power receiver receptacle 233 may be mounted in face 310A. As illustrated in FIG. 3C, face 310A may include multiple power receiver receptacles 233A-233N. For example, multiple power receiver receptacles 233A-233N may be mounted in face 310A. As shown in FIG. 3D, PDM 232 may have a face 310B. As illustrated, face 310B may be orthogonal to longitudinal axis 262. As shown in FIG. 3E, face 310B may include a power transmission connector 320. For example, a power transmission connector 320 may be mounted in face 310B. In one or more embodiments, power transmission connector 320 may be coupled to a power receiver interface 252. For example, power transmission connector 320 may provide power to a power receiver interface 252.

Figure 3F:
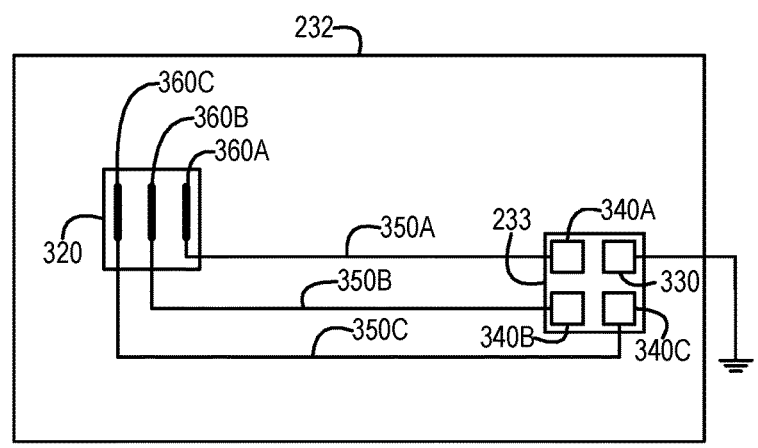
FIG. 3F illustrates an example of conductors of a power distribution module, according to one or more embodiments.

Turning now to FIG. 3F, an example of conductors of a power distribution module is illustrated, according to one or more embodiments. As shown, power receiver receptacle 233 may include a ground receptacle 330. As illustrated, power receiver receptacle 233 may include receptacles 340A-340C. In one or more embodiments, receptacles 340A-340C may receive three-phase power. In one example, receptacle 340A may receive a first phase of the three-phase power. In a second example, receptacle 340B may receive a second phase of the three-phase power. In another example, receptacle 340C may receive a third phase of the three-phase power. As an example, the three-phase power may be three-phase wye power. As another example, the three-phase power may be three-phase delta power.

As illustrated, power transmission conductors 350A-350C may be respectively coupled to receptacles 340A-340C. As shown, power transmission conductors 350A-350C may be respectively coupled to conductors 360A-

360C of power transmission connector 320. In one example, power transmission conductor 350A may be configured to provide a first phase of the three-phase power to conductor 360A. In one example, power transmission conductor 350B may be configured to provide a second phase of the three-phase power to conductor 360B. In one example, power transmission conductor 350C may be configured to provide a second phase of the three-phase power to conductor 360C.

Figure 4A:
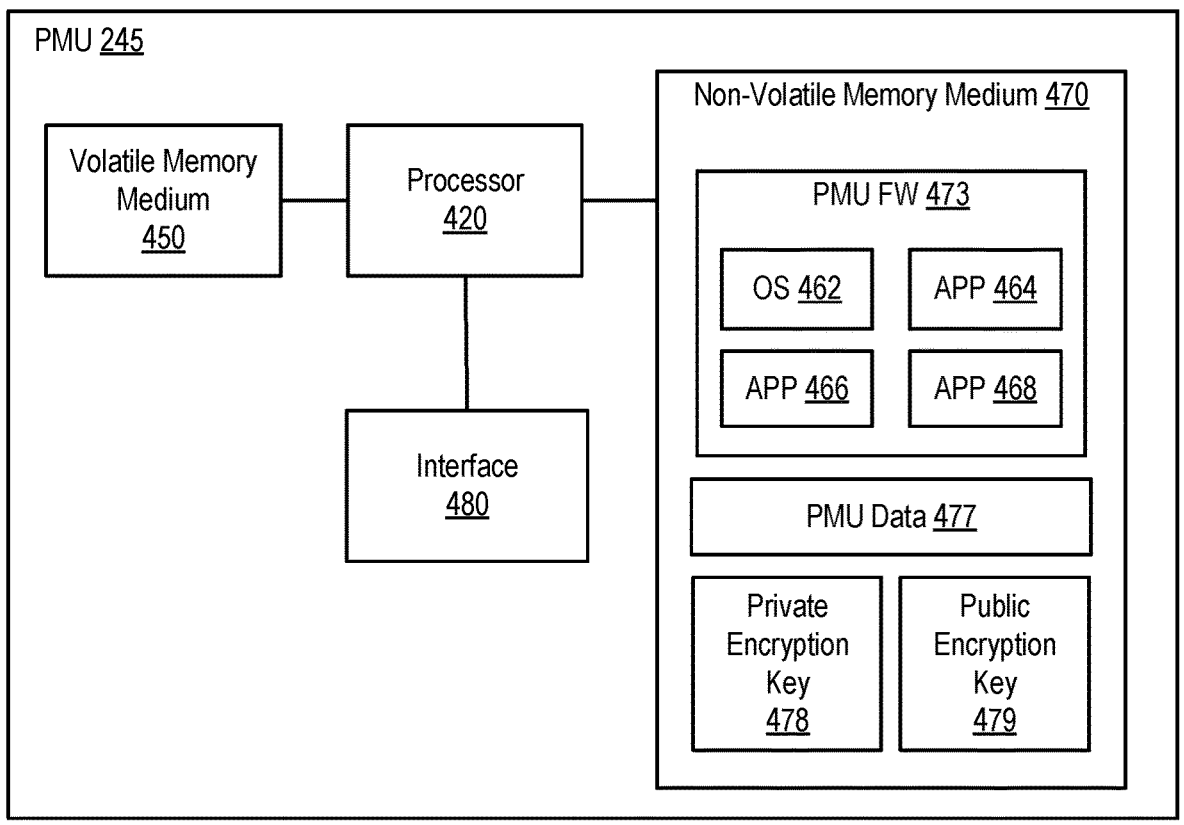
FIG. 4A illustrates an example of a power distribution unit monitoring unit, according to one or more embodiments.

Turning now to FIG. 4A, an example of a power distribution unit monitoring unit is illustrated, according to one or more embodiments. In one or more embodiments, PMU 245 may be or include a remote access monitoring unit. In one example, PMU 245 may monitor one or more environmental attributes associated with a PMS 220. In another example, PMU 245 may monitor one or more environmental attributes associated with a rack 210. In one or more embodiments, PMU 245 may include one or more of a processor, a memory, and a network interface, among others. For example, PMU 245 may include and/or may provide power management, virtual media access, and/or remote console capabilities, among others, which may be available via a web browser and/or a command line interface.

In one or more embodiments, PMU 245 may include a microcontroller. For example, the microcontroller may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, PMU 245 may be or include an application processor. In one example, PMU 245 may be or include an ARM Cortex-A processor. In another example, PMU 245 may be or include an Intel Atom processor. In one or more embodiments, PMU 245 may include one or more of a field programmable gate array (FPGA) and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

As shown, PMU 245 may include a processor 420, a volatile memory medium 450, a non-volatile memory medium 470, and an interface 480. As illustrated, non-volatile memory medium 470 may include a PMU firmware (FW) 473, which may include an OS 462 and APPs 464-468, and may include PMU data 477. In one example, OS 462 may be or include a real-time operating system (RTOS). For instance, the RTOS may be or include FreeRTOS, OpenRTOS, SafeRTOS, QNX, ThreadX, VxWorks, NuttX, TI-RTOS, eCos, MicroC/OS, or Zephyr, among others. In a second example, OS 462 may be or include an Unix-like operating system. For instance, the Unix-like operating system may be or include LINUX®, FREEBSD®, NETBSD®, OpenBSD, Minix, Xinu, or Darwin, among others. In another example, OS 462 may be or include a portable operating system interface (POSIX) compliant operating system. As illustrated, non-volatile memory medium 470 may include a private encryption key 478. As shown, non-volatile memory medium 470 may include a public encryption key 479. In one or more embodiments, private encryption key 478 may be different from public encryption key 479. For example, private encryption key 478 and public encryption key 479 may be asymmetric encryption keys. In one instance, data encrypted via private encryption key 478 may be decrypted via public encryption key 479. In another instance, data encrypted via public encryption key 479 may be decrypted via private encryption key 478. In one or more embodiments, PMU 245 may utilize one or more of public encryption key 479 and private encryption key 478 in secure communications and/or in authenticating data.

In one or more embodiments, interface 480 may include circuitry that enables communicatively coupling to one or more devices. In one example, interface 480 may include circuitry that enables communicatively coupling to one or more buses. For instance, the one or more buses may include one or more buses described herein, among others. In a second example, interface 480 may include circuitry that enables one or more interrupt signals to be received. In one instance, interface 480 may include general purpose input/output (GPIO) circuitry, and the GPIO circuitry may enable one or more interrupt signals to be received and/or provided via at least one interrupt line. In another instance, interface 480 may include GPIO circuitry that may enable PMU 245 to provide and/or receive signals associated with other circuitry (e.g., diagnostic circuitry, etc.). In a third example, interface 480 may include circuitry that enables communicatively coupling to one or more networks. For instance, interface 480 may include circuitry that enables communicatively coupling to network 246. In another example, interface 480 may include a network interface. In one instance, the network interface may communicate with network 246 in a wired fashion. In another instance, the network interface may communicate with network 246 in a wireless fashion. A further description of interface 480 is provided with reference to FIG. 4B.

In one or more embodiments, one or more of OS 462 and APPs 464-468 may include processor instructions executable by processor 420. In one example, processor 420 may execute processor instructions of one or more of OS 462 and APPs 464-468 via non-volatile memory medium 470. In another example, one or more portions of the processor instructions of the one or more of OS 462 and APPs 464-468 may be transferred to volatile memory medium 450, and processor 420 may execute the one or more portions of the processor instructions of the one or more of OS 462 and APPs 464-468 via volatile memory medium 450. In one or more embodiments, processor 420 may execute instructions in accordance with at least a portion of one or more systems, at least a portion of one or more flowcharts, one or more methods, and/or at least a portion of one or more processes described herein. For example, non-volatile memory medium 470 and/or volatile memory medium 450 may store instructions that may be executable in accordance with at least a portion of one or more systems, at least a portion of one or more flowcharts, at least a portion of one or more methods, and/or at least a portion of one or more processes described herein. In one or more embodiments, processor 420 may execute instructions in accordance with at least a portion of one or more of systems, flowcharts, at least a portion of one or more methods, and/or at least a portion of one or more processes described herein. For example, non-volatile memory medium 470 and/or volatile memory medium 450 may store instructions that may be executable in accordance with at least a portion of one or more of systems, at least a portion of one or more flowcharts, at least a portion of one or more methods, and/or at least a portion of one or more processes described herein. In one or more embodiments, processor 420 may utilize PMU data 477. In one example, processor 420 may utilize PMU data 477 via non-volatile memory medium 470. In another example, one or more portions of PMU data 477 may be transferred to volatile memory medium 450, and processor 420 may utilize PMU data 477 via volatile memory medium 450. In one or more embodiments, PMU data 477 may include one or more management information bases. For example, a management information base (MIB) may include a database. For instance, information associated with a PMS 220 may be stored and/or retrieved via a MIB.

Figure 4B:
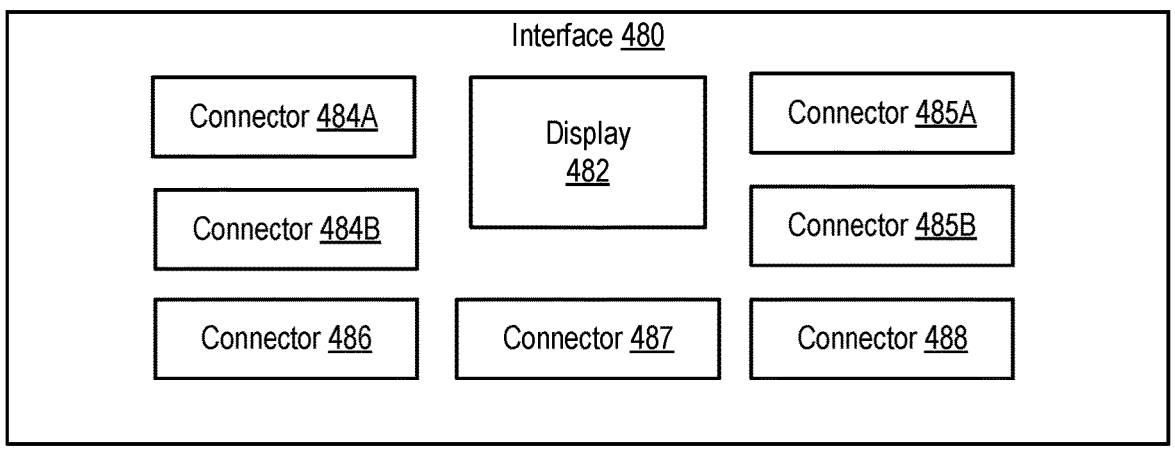
FIG. 4B illustrates an example of an interface of a power distribution unit monitoring unit, according to one or more embodiments.

Turning now to FIG. 4B, an example of an interface of a power distribution unit monitoring unit is illustrated, according to one or more embodiments. As shown, interface 480 may include a display 482. For example, display 482 may display information to a user. For instance, display 482 may include a liquid crystal display (LCD), a light emitting diode (LED) display, or an organic LED (OLED) display, among others. In one or more embodiments, display 482 may include a touch screen. For example, display 482 may receive user input.

As illustrated, interface 480 may include multiple connectors. In one example, connectors 484A and 484B may include RJ 11 connectors. For instance, a connector 484 may be coupled to a cable 249, which may be coupled to a monitoring device 247. In a second example, connectors 485A and 485B may include RJ 12 connectors. For instance, connectors 485A and 485B may be utilized to monitor temperature and/or relative humidity. In a third example, a connector 486 may include a RJ 45 connector. For instance, connector 486 may be utilized to couple PMU 245 to network 246. In a fourth example, a connector 487 may include a RS-232 connector. For instance, connector 487 may provide a serial administrative coupling to PMU 245. In another example, a connector 488 may include a USB connector. For instance, PMU 245 may receive a firmware update via connector 488.

Figure 5:
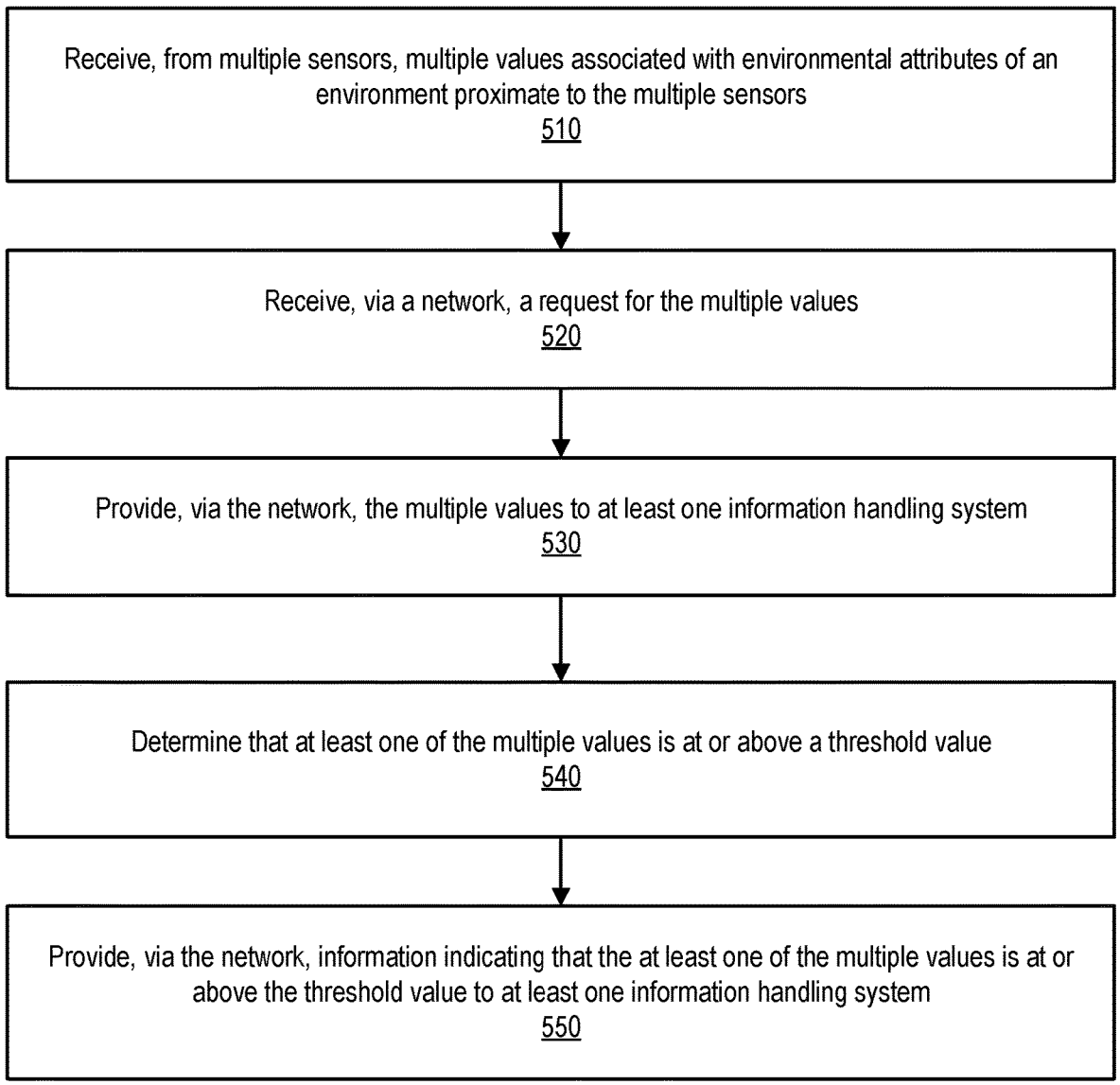
FIG. 5 illustrates an example of a method of operating a power distribution unit monitoring unit, according to one or more embodiments

Turning now to FIG. 5, an example of a method of operating a power distribution unit monitoring unit is illustrated, according to one or more embodiments. At 510, multiple values associated with environmental attributes of an environment proximate to multiple sensors may be received from the multiple sensors. For example, PMU 245 may receive, from multiple sensors, multiple values (e.g., digital data) associated with environmental attributes of an environment proximate to the multiple sensors. In one instance, a single monitoring device 247 may include the multiple sensors. In another instance, multiple monitoring devices 247 may include the multiple sensors. As one example, a monitoring device 247 may include a single sensor. As another example, a monitoring device 247 may include at least two sensors. In one or more embodiments, an environment proximate to the multiple sensors may include an environment within a radius one or two meters from the multiple sensors. In one or more embodiments, the environmental attributes may include at least a value of temperature and a value of relative humidity, among others. In one or more embodiments, PMU 245 may include a serial interface coupled to processor 420. For example, receiving the multiple values associated with the environmental attributes of the environment proximate to the multiple sensors may include receiving the multiple values via the serial interface.

At 520, a request for the multiple values may be received via the network. For example, PMU 245 may receive, via network 246, a request for the multiple values. For instance, PMU 245 may receive, via network 246, a request for the multiple values from an IHS 110. At 530, the multiple values may be provided to at least one information handling system via a network. For example, PMU 245 may provide, via network 246, the multiple values to at least one IHS 110. In one instance, the at least one IHS 110 may be housed by rack 210. In another instance, the at least one IHS 110 may not be housed by rack 210.

At 540, it may be determined that at least one of the multiple values is at or above a threshold value. For example, PMU 245 may determine that at least one of the multiple values is at or above a threshold value. At 550, information indicating that the at least one of the multiple values is at or above the threshold value may be provided to the at least one information handling system. For example, PMU 245 may provide, via network 246, information indicating that the at least one of the multiple values is at or above the threshold value to the at least one information handling system.

In one or more embodiments, one or more of the method and/or process elements and/or one or more portions of a method and/or a process element may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with at least a portion of one or more flowcharts, at least a portion of one or more systems, at least a portion of one or more methods, and/or at least a portion of one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A power distribution system, comprising:
    a power distribution module, including:
        a plurality of power receiver receptacles in a first face of the power distribution module, which is orthogonal to a longitudinal axis of the power distribution module;
        a plurality of power transmission conductors coupled to the first plurality of power receiver receptacles; and
        power transmission connectors in a second face of the power distribution module, which is orthogonal to the longitudinal axis of the power distribution module;
        a plurality of spring actuating locking pins;
        wherein the plurality of power receiver receptacles are configured to receive three- phase power; and
        wherein the plurality of power transmission conductors are configured to:
            provide a first phase of the three-phase power to a first conductor of the power transmission connectors;
            provide a second phase of the three-phase power to a second conductor of the power transmission connectors; and provide a third phase of the three-phase power to a third conductor of the power transmission connectors, a power distribution module receptacle, including: conductors;

wherein the power distribution module is configured to be coupled to the power distribution module receptacle with the power transmission connectors of the power distribution module aligned with the conductors of the power distribution receptacle via the plurality of spring actuating locking pins.

2. The power distribution system of claim 1, wherein the three-phase power is three-phase wye power.

3. The power distribution system of claim 1, wherein the three-phase power is three-phase delta power.

4. The power distribution system of claim 1, further including:
   a power distribution unit monitoring unit, including:
      at least one processor; and
      a memory medium, coupled to the at least one processor, that stores instructions executable by the at least one processor, which when executed by the at least one processor, cause the power distribution unit monitoring unit to:
         receive, from a plurality of sensors, a plurality of values associated with environmental attributes of an environment proximate to the plurality of sensors; and
         provide, via a network, the plurality of values to at least one information handling system.

5. The power distribution system of claim 4, wherein the instructions further cause the power distribution unit monitoring unit to receive, via the network, a request for the plurality of values.

6. The power distribution system of claim 4, wherein the environmental attributes include at least one of a value of temperature and a value of relative humidity.

7. The power distribution system of claim 4, the power distribution system unit monitoring unit further comprising:
   a serial interface coupled to the at least on processor;
   wherein, to receive the plurality of values associated with the environmental attributes of the environment proximate to the plurality of sensors, the instructions further cause the power management unit to receive the plurality of values via the serial interface.

8. The power distribution system of claim 4, wherein the instructions further cause the power distribution unit monitoring unit to:
   determine that at least one of the plurality of values is at or above a threshold value; and
   provide, via the network, information indicating that the at least one of the plurality of values is at or above the threshold value to the at least one information handling system.

* * * * *